United States Patent
Hagelin et al.

(10) Patent No.: US 10,192,850 B1
(45) Date of Patent: Jan. 29, 2019

(54) BONDING PROCESS WITH INHIBITED OXIDE FORMATION

(71) Applicant: SiTime Corporation, Santa Clara, CA (US)

(72) Inventors: Paul M. Hagelin, Saratoga, CA (US); Charles I. Grosjean, Los Gatos, CA (US)

(73) Assignee: SiTime Corporation, Santa Clara, CA (US)

( * ) Notice: Subject to any disclaimer, the term of this patent is extended or adjusted under 35 U.S.C. 154(b) by 0 days.

(21) Appl. No.: 15/709,371

(22) Filed: Sep. 19, 2017

Related U.S. Application Data

(60) Provisional application No. 62/396,817, filed on Sep. 19, 2016.

(51) Int. Cl.
*H01L 23/00* (2006.01)

(52) U.S. Cl.
CPC .... *H01L 24/83* (2013.01); *H01L 2224/83048* (2013.01); *H01L 2224/83143* (2013.01); *H01L 2224/83355* (2013.01); *H01L 2224/83895* (2013.01); *H01L 2224/83911* (2013.01); *H01L 2924/01047* (2013.01); *H01L 2924/01079* (2013.01)

(58) Field of Classification Search
CPC ...................... H01L 24/83; H01L 2224/83048
See application file for complete search history.

(56) References Cited

U.S. PATENT DOCUMENTS

| | | |
|---|---|---|
| 3,728,090 A | 4/1973 | Hoffman et al. |
| 5,083,466 A | 1/1992 | Holm-Kennedy et al. |
| 5,249,732 A | 10/1993 | Thomas |
| 5,359,893 A | 11/1994 | Dunn |
| 5,367,194 A | 11/1994 | Beatty |
| 5,426,070 A | 6/1995 | Shaw et al. |
| 5,481,914 A | 1/1996 | Ward |
| 5,485,032 A | 1/1996 | Schepis et al. |
| 5,604,312 A | 2/1997 | Lutz |
| 5,656,778 A | 8/1997 | Roszhart |
| 5,659,195 A | 8/1997 | Kaiser et al. |
| 5,693,574 A | 12/1997 | Schuster et al. |
| 5,703,293 A | 12/1997 | Zabler et al. |
| 5,728,936 A | 3/1998 | Lutz |
| 5,780,740 A | 7/1998 | Lee et al. |
| 5,889,207 A | 3/1999 | Lutz |
| 5,895,850 A | 4/1999 | Buestgens |
| 5,915,168 A | 6/1999 | Salatino et al. |
| 5,992,233 A | 11/1999 | Clark |

(Continued)

*Primary Examiner* — Errol Fernandes
(74) *Attorney, Agent, or Firm* — Charles Shemwell

(57) ABSTRACT

First and second contacts are formed on first and second wafers from disparate first and second conductive materials, at least one of which is subject to surface oxidation when exposed to air. A layer of oxide-inhibiting material is disposed over a bonding surface of the first contact and the first and second wafers are positioned relative to one another such that a bonding surface of the second contact is in physical contact with the layer of oxide-inhibiting material. Thereafter, the first and second contacts and the layer of oxide-inhibiting material are heated to a temperature that renders the first and second contacts and the layer of oxide-inhibiting material to liquid phases such that at least the first and second contacts alloy into a eutectic bond.

18 Claims, 1 Drawing Sheet

(56) References Cited

U.S. PATENT DOCUMENTS

| | | |
|---|---|---|
| 5,996,409 A | 12/1999 | Funk et al. |
| 6,036,872 A | 3/2000 | Andrew et al. |
| 6,122,961 A | 9/2000 | Geen et al. |
| 6,128,961 A | 10/2000 | Haronian |
| 6,153,917 A | 11/2000 | Matsunaga et al. |
| 6,189,381 B1 | 2/2001 | Huang et al. |
| 6,199,748 B1 | 3/2001 | Zhu et al. |
| 6,229,190 B1 | 5/2001 | Bryzek et al. |
| 6,250,157 B1 | 6/2001 | Touge |
| 6,391,673 B1 | 5/2002 | Ha et al. |
| 6,426,687 B1 | 7/2002 | Osborn |
| 6,430,998 B2 | 8/2002 | Kawai et al. |
| 6,433,411 B1 | 8/2002 | Degani et al. |
| 6,448,109 B1 | 9/2002 | Karpman |
| 6,452,238 B1 | 9/2002 | Orcutt et al. |
| 6,479,320 B1 | 11/2002 | Gooch |
| 6,480,320 B2 | 11/2002 | Nasiri |
| 6,481,283 B1 | 11/2002 | Cardarelli |
| 6,481,284 B2 | 11/2002 | Geen et al. |
| 6,481,285 B1 | 11/2002 | Shkel et al. |
| 6,487,908 B2 | 12/2002 | Geen et al. |
| 6,508,122 B1 | 1/2003 | Mccall et al. |
| 6,513,380 B2 | 2/2003 | Reeds et al. |
| 6,519,075 B2 | 2/2003 | Carr et al. |
| 6,528,344 B2 | 3/2003 | Kang |
| 6,528,887 B2 | 3/2003 | Daneman et al. |
| 6,533,947 B2 | 3/2003 | Nasiri et al. |
| 6,555,417 B2 | 4/2003 | Spooner et al. |
| 6,559,530 B2 | 5/2003 | Hinzel et al. |
| 6,621,137 B1 | 9/2003 | Ma et al. |
| 6,635,509 B1 | 10/2003 | Quellet |
| 6,650,455 B2 | 11/2003 | Miles |
| 6,660,564 B2 | 12/2003 | Brady |
| 6,686,639 B1 | 2/2004 | Tsai |
| 6,770,569 B2 | 8/2004 | Foerstner et al. |
| 6,794,272 B2 | 9/2004 | Turner et al. |
| 6,796,178 B2 | 9/2004 | Jeong et al. |
| 6,808,955 B2 | 10/2004 | Ma et al. |
| 6,852,926 B2 | 2/2005 | Ma et al. |
| 6,892,575 B2 | 5/2005 | Nasiri et al. |
| 6,918,297 B2 | 7/2005 | Macgugan |
| 6,936,491 B2 | 8/2005 | Partridge et al. |
| 6,936,494 B2 | 8/2005 | Cheung |
| 6,939,473 B2 | 9/2005 | Nasiri et al. |
| 6,943,484 B2 | 9/2005 | Clark et al. |
| 7,004,025 B2 | 2/2006 | Tamura |
| 7,028,547 B2 | 4/2006 | Shiratori et al. |
| 7,104,129 B2 | 9/2006 | Nasiri et al. |
| 7,196,404 B2 | 3/2007 | Schirmer et al. |
| 7,247,246 B2 | 7/2007 | Nasiri et al. |
| 7,642,692 B1 | 1/2010 | Pulskamp |
| 7,907,838 B2 | 3/2011 | Nasiri et al. |
| 8,022,554 B2 | 9/2011 | Gupta et al. |
| 8,220,330 B2 | 7/2012 | Miller et al. |
| 8,234,774 B2 | 8/2012 | Hagelin et al. |
| 8,236,577 B1 | 8/2012 | Hsu et al. |
| 8,871,551 B2 | 10/2014 | Partridge et al. |
| 2001/0001931 A1 | 5/2001 | Fujii et al. |
| 2001/0006248 A1 | 7/2001 | Allen et al. |
| 2001/0009110 A1 | 7/2001 | Tmai |
| 2001/0034076 A1 | 10/2001 | Martin |
| 2002/0016058 A1 | 2/2002 | Zhao |
| 2002/0043706 A1 | 4/2002 | Jerominek et al. |
| 2002/0051258 A1 | 5/2002 | Tamura |
| 2002/0117728 A1 | 8/2002 | Brisnihhan et al. |
| 2002/0132062 A1 | 9/2002 | Jacobs |
| 2002/0135047 A1 | 9/2002 | Funk et al. |
| 2002/0179126 A1 | 12/2002 | DeYoung et al. |
| 2002/0197002 A1 | 12/2002 | Lin |
| 2003/0002019 A1 | 1/2003 | Miller |
| 2003/0016337 A1 | 1/2003 | Duncan et al. |
| 2003/0038327 A1 | 2/2003 | Smith |
| 2003/0054588 A1 | 3/2003 | Patel et al. |
| 2003/0074967 A1 | 4/2003 | Tang et al. |
| 2003/0110858 A1 | 6/2003 | Kim et al. |
| 2003/0141561 A1 | 7/2003 | Fischer et al. |
| 2003/0146464 A1 | 8/2003 | Prophet |
| 2003/0155643 A1 | 8/2003 | Freidhoff |
| 2003/0161949 A1 | 8/2003 | Ashurst et al. |
| 2003/0164041 A1 | 9/2003 | Jeong et al. |
| 2003/0178635 A1 | 9/2003 | Volant et al. |
| 2003/0183916 A1 | 10/2003 | Heck et al. |
| 2003/0215974 A1 | 11/2003 | Kawasaki et al. |
| 2004/0016989 A1 | 1/2004 | Ma et al. |
| 2004/0055380 A1 | 3/2004 | Shcheglov et al. |
| 2004/0065932 A1 | 4/2004 | Reichenbach et al. |
| 2004/0106294 A1 | 6/2004 | Lee et al. |
| 2004/0183214 A1 | 9/2004 | Partridge et al. |
| 2004/0248344 A1 | 12/2004 | Partridge et al. |
| 2005/0081633 A1 | 4/2005 | Nasiri et al. |
| 2005/0101059 A1 | 5/2005 | Yang |
| 2005/0156260 A1 | 7/2005 | Partridge et al. |
| 2005/0170656 A1 | 8/2005 | Nasiri et al. |
| 2005/0195050 A1 | 9/2005 | Lutz et al. |
| 2005/0253206 A1 | 11/2005 | Bureau et al. |
| 2005/0260828 A1 | 11/2005 | Yuasa |
| 2005/0262929 A1 | 12/2005 | Felton et al. |
| 2005/0285172 A1 | 12/2005 | Freeman et al. |
| 2006/0246631 A1 | 11/2006 | Lutz et al. |
| 2008/0116534 A1 | 5/2008 | Grosjean et al. |
| 2008/0283990 A1 | 11/2008 | Nasiri et al. |
| 2012/0326248 A1* | 12/2012 | Daneman .................. B81B 7/02 257/415 |
| 2013/0168852 A1* | 7/2013 | Liang .................. B81C 1/00293 257/737 |
| 2015/0099316 A1* | 4/2015 | Ryu ....................... B23K 1/20 438/26 |
| 2016/0002029 A1 | 1/2016 | Nasiri et al. |

* cited by examiner

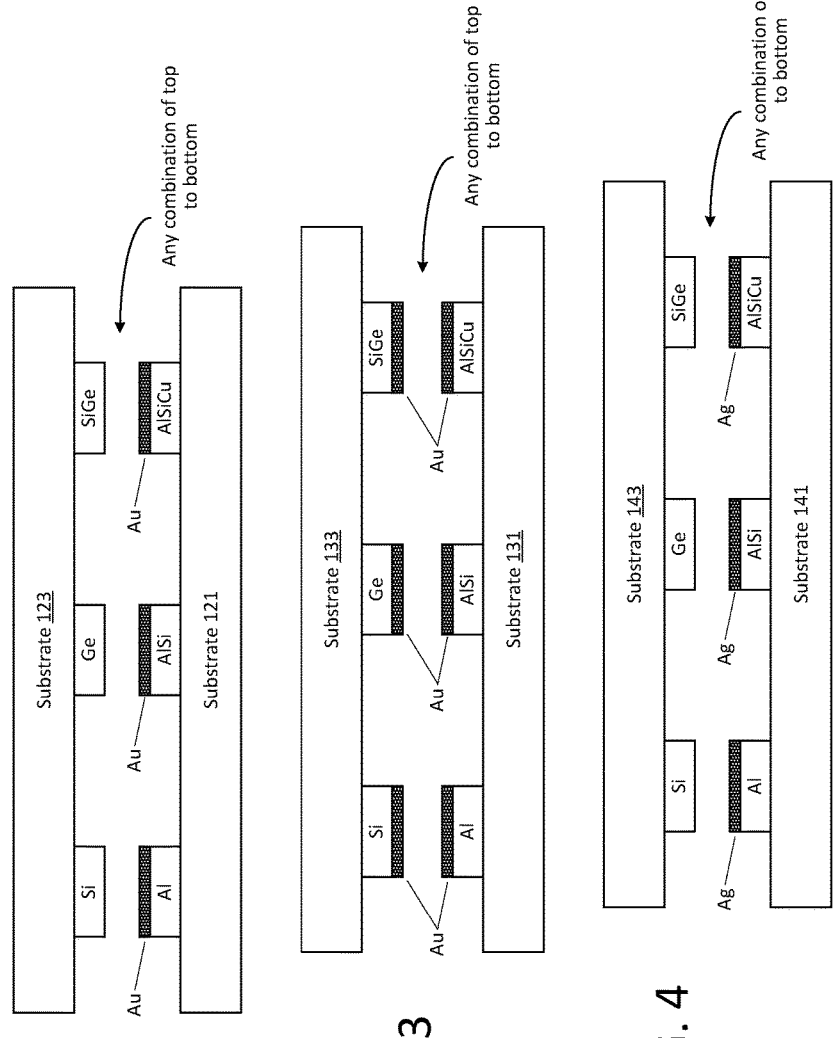

BONDING PROCESS WITH INHIBITED OXIDE FORMATION

INCORPORATION BY REFERENCE

This application hereby claims priority to and incorporates by reference U.S. Provisional Patent Application No. 62/396,817 filed Sep. 19, 2016 ("Oxide-Inhibited Wafer Bonding and Soldering").

TECHNICAL FIELD

The present disclosure relates to semiconductor wafer-to-wafer, die-to-wafer and die-to-die bonding.

BACKGROUND

In a solder system containing aluminum on one side, as in the case of a CMOS wafer, the problem exists of rapid native oxidation of the aluminum surface—forming an oxide layer that can impede solder bonding generally, and wafer-to-wafer bonding in particular. Common methods used to combat the oxide formation include pre-bond cleaning (plasma, chemical), high force during bonding (breaking the oxide), and gas treatment prior to bonding (forming gas at temperature), all of which add complexity and cost to the bonding operation.

DRAWINGS

The various embodiments disclosed herein are illustrated by way of example, and not by way of limitation, in the figures of the accompanying drawings and in which like reference numerals refer to similar elements and in which:

FIG. 1 contrasts a conventional, oxide-plagued bonding approach with an exemplary oxide-inhibited bonding technique;

FIG. 2 illustrates a variety of materials that may be used to enable oxide-inhibited bonding of counterpart substrates;

FIG. 3 illustrates the same bonding materials as FIG. 2, but with oxide-inhibitant disposed on the bonding surfaces on both counterpart substrates; and FIG. 4 illustrates the optional bonding materials of FIG. 2 (Al, AlSi, AlSiCu) disposed on counterpart substrates and capped with silver oxide inhibitant rather than the gold oxide inhibitant shown in prior drawing figures.

DETAILED DESCRIPTION

In various embodiments herein, bonding surface(s) of conductive contacts deposited or otherwise formed on a wafer or die is capped with another material to inhibit (or prevent, limit or control) the oxidation of the bonding surface. By using a capping material that does not oxidize or has an easier to remove oxide, steps commonly used to remove undesired oxide can be reduced or eliminated from the bonding process. In particular, bonding can be performed at substantially lower force which advantageously lessens relative movement of the precisely-aligned substrates during wafer bonding, flowing of the solder during liquidus, etc.

Materials that may be used for capping the aluminum layer include, for example and without limitation, the family of noble materials (e.g., rhenium, ruthenium, rhodium, palladium, silver, osmium, iridium, platinum, gold, etc. and various alloys thereof) and other materials such as copper, titanium, nickel, indium, tin, and zinc. Materials that form some oxide, but are softer than aluminum are also useful as lower force can be used to cause mechanical deformation and thereby expose un-oxidized material at the bonding surface of the contact.

In one embodiment, the capping material is deposited on the aluminum in an environment that is free of oxidation (e.g., in the same chamber, or multiple deposition chambers connected by a common vacuum chamber), or in a chemical environment such as a plating bath, etc. in which oxidation is removed as part of the process. Where oxide removal is not inherent in the inhibitant disposition process, any exposure of the bonding surface to an oxidizing environment is limited in time and/or concentration (i.e., limited concentration of oxidizing agents) such that the exposed contact surface remains primarily that of the bonding surface material (e.g., aluminum, aluminum alloy, etc.) In yet other embodiments, the substrate with aluminum or other oxidation-prone bonding surface is further processed, and then later cleaned (for example in a sputter etch) to remove the oxide before depositing the capping material (again, with limited pre-capping exposure to an oxidizing environment) to form a final structure with a layer of aluminum (including any of various aluminum alloys) and the capping material.

In practice, the capping material is chosen for compatibility with the overall requirements of the intended solder bond. For example, in the case of a binary eutectic (two materials forming a eutectic bond), the capping material may form either with the aluminum alloy, or with the complementary substrate material, or both. The resulting ternary system (or quaternary, or higher material count system) is generally chosen to melt at a reasonable/tolerable temperature in view of the system elements, and to form a stable solder joint.

FIG. 1 contrasts a conventional, oxide-plagued bonding approach (relatively high force applied to break aluminum oxide) with an exemplary oxide-inhibited bonding technique in which aluminum contacts are capped with thin gold films to inhibit oxide formation and thereby enable formation of eutectic wafer-to-wafer (or die-to-wafer or die-to-die) bonds with substantially reduced applied force.

FIG. 2 illustrates a variety of materials that may be used to enable oxide-inhibited bonding of counterpart substrates 121 and 123. As shown, aluminum (optionally alloyed with trace to significant amounts of silicon and/or copper, for example) is disposed on substrate 121 and capped with an oxide inhibitant of Gold (e.g., 10-100 nm thick, though thicker or thinner films may be used), while silicon, germanium, or an alloy of both (SiGe) is disposed on the counterpart substrate 123. Any of the bonding materials on substrate 121 may be bonded with any of the bonding materials on substrate 123 to form a bond within a given system, and a diversity of bond types may exist within the same system. Substrates 121 and 123 may themselves be different wafers (e.g., two different CMOS wafers, a CMOS wafer and a microelectromechanical-system (MEMS) wafer, etc. to be singulated into individual dies after wafer-to-wafer bonding), different dies, or a die and a wafer. With respect to different wafer or die types (e.g., MEMS and CMOS), any of the bonding material pairs may be reversed in orientation from those depicted (e.g., Si/Ge/SiGe may be disposed on MEMS wafer or CMOS wafer) and a diversity of such orientations may exist within the same system. Also, either or both of substrates 121 and 123 may individually include one or more constituent substrates and/or other structural components (e.g., resonant MEMS structures, metal layers, oxide layers, vias, encapsulation chambers, etc.).

FIG. 3 illustrates the same bonding materials as FIG. 2, but with oxide-inhibitant (gold in the examples of FIGS. 2 and 3) disposed on the bonding surfaces on each of substrates 131 and 133. Thus, aluminum (or alloy) with a cap of gold is disposed on substrate 131, and silicon/germanium (one, the other, or alloy of the two) with a cap of gold is disposed on substrate 133. As in FIG. 3, any of the bonding materials on substrate 131 may be bonded with any of the bonding materials on substrate 133 to form a bond within a given system, and a diversity of bond types may exist within the same system. Also, substrates 131 and 133 may be different wafers (e.g., two different CMOS wafers, a CMOS wafer and a microelectromechanical-system (MEMS) wafer, etc. to be singulated into individual dies after wafer-to-wafer bonding), different dies, or a die and a wafer, and either or both of substrates 131 and 133 may individually include one or more constituent substrates and/or other structural components (e.g., resonant MEMS structures, vias, encapsulation chambers, etc.). With respect to different wafer or die types (e.g., MEMS and CMOS), any of the bonding material pairs may be reversed in orientation from those depicted (e.g., Si/Ge/SiGe may be disposed on MEMS wafer or CMOS wafer) and a diversity of such orientations may exist within the same system.

Despite the gold-cap oxide inhibitant shown in FIGS. 2 and 3, any of the depicted bonding surfaces/materials may be capped with oxide inhibitants other than gold. FIG. 4, for example, illustrates the bonding materials of FIG. 2 (Al, AlSi, AlSiCu) disposed on counterpart substrates 141 and 143 and capped with oxide inhibitants of silver instead of gold. The counterpart bonding surfaces may similarly be capped with silver instead of gold (i.e., arrangement shown in FIG. 3, but with silver inhibitant instead of gold).

In general, oxide-inhibited bonding processes according to the techniques shown and described herein involve substrate alignment (e.g., wafer alignment in a wafer bond, singulated die alignment in a die-to-die bond), substrate-to-substrate contact with varying degrees of force (including a force ramp), and then elevation (e.g., ramp) to at least a first temperature where particular binary combinations reach liquidus (for example, a temperature at which silicon with gold cap reaches liquidus). Depending on the choice of materials, the ternary or larger combination may reach liquidus upon elevation to the first temperature, or, if not, further elevation to a second temperature and possibly additional elevations to third, or higher temperature targets are carried out to achieve liquidus of the ternary (or quaternary, etc.) system. In embodiments having multiple different liquidus temperatures, elevation to each temperature may be accompanied by a pause of variable and/or controlled duration (i.e., plateau at a particular temperature) before commencing further elevation toward the higher temperature (plateau). In an alternative embodiment having multiple liquidus temperatures, the temperature may be raised directly to a higher than eutectic temperature which might be useful in achieving certain alloy compositions. In another embodiment, prior to substrate alignment and bonding, one or both wafers are heated to one or more predetermined temperatures to alloy the oxide-inhibiting material with the conductive material that constitutes the underlying contact. In general, heating to a single alloy-forming temperature ("alloying temperature") is sufficient where oxide-inhibitant is disposed over the bonding surfaces of only one of the counterpart wafers or where a single temperature setpoint is sufficient to alloy respective dispositions of oxide-inhibitant and underlying contacts on both of counterpart wafers. Conversely, where alloying temperatures of oxide-inhibitant and underlying contacts are substantially different with respect to counterpart wafers, each wafer may be separately heated to a respective alloying temperature. Any or all of the alloying temperatures may be higher or lower than the eutectic bonding temperature. Also, in all cases, temperature elevation for alloying or bonding purposes may be monotonic (until eventual cool down) or may be characterized by one or more valleys or inflections.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. The term "contact" herein generally refers to a conductive material that makes up part of a conductive bond, though "physical contact" refers to physical touching—a distinction generally clear from context. "Contact interface" refers to a bond interface. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of forming a wafer-to-wafer bond, the method comprising:
    forming, on a first wafer, a first contact from a first conductive material subject to surface oxidation when exposed to air;
    disposing a layer of oxide-inhibiting material over a bonding surface of the first contact;
    forming, on a second wafer, a second contact from a second conductive material that, upon heating while in physical contact with the first conductive material, will form a eutectic bond;
    positioning the first and second wafers relative to one another such that a bonding surface of the second contact is in physical contact with the layer of oxide-inhibiting material; and
    after positioning the first and second wafers relative to one another, heating the first and second contacts and the layer of oxide-inhibiting material to a first temperature that renders the first and second contacts and the layer of oxide-inhibiting material to liquid phases such that at least the first and second contacts alloy into a eutectic bond;
    the method further comprising, prior to positioning the first and second wafers relative to one another such that the bonding surface of the second contact is in physical contact with the layer of oxide-inhibiting material, heating the first contact and the layer of oxide-inhibiting material to a second temperature that alloys the oxide-inhibiting material with the first conductive material.

2. The method of claim 1 wherein forming the first contact from the first conductive material subject to surface oxidation comprises forming the first contact from at least one of aluminum, aluminum-silicon alloy, aluminum-copper alloy or aluminum-silicon-copper alloy.

3. The method of claim 1 wherein at least one of the first and second wafers is a complementary metal oxide semiconductor (CMOS) wafer.

4. The method of claim 3 wherein one of the first and second wafers is a microelectromechanical-system (MEMS) wafer.

5. The method of claim 1 wherein forming the second contact from the second conductive material comprises forming the second contact from at least one of silicon, germanium or a silicon-germanium alloy.

6. The method of claim 1 wherein disposing the layer of oxide-inhibiting material over the bonding surface of the first contact comprises disposing a layer of noble metal over the bonding surface of the first contact.

7. The method of claim 1 wherein disposing the layer of oxide-inhibiting material over the bonding surface of the first contact comprises disposing the layer of oxide-inhibiting material over the bonding surface of the first contact with such limited exposure to an oxidizing environment that the bonding surface of the first contact remains primarily that of the first conductive material.

8. The method of claim 1 wherein positioning the first and second wafers relative to one another such that a bonding surface of the second contact is in physical contact with the layer of oxide-inhibiting material comprises pressing the second contact against the layer of oxide-inhibiting material to establish a pressure therebetween within a predetermined range.

9. The method of claim 1 wherein heating the first and second contacts and the layer of oxide-inhibiting material to the first temperature comprises heating the first and second contacts and the layer of oxide-inhibiting material while pressing the second contact against the layer of oxide-inhibiting material.

10. The method of claim 9 wherein pressing the second contact against the layer of oxide-inhibiting material to establish a pressure therebetween within a predetermined range comprises pressing the second contact against the layer of oxide-inhibiting material with sufficient force to crush the layer of oxide-inhibiting material.

11. The method of claim 1 wherein heating the first and second contacts and the layer of oxide-inhibiting material to the first temperature that renders the first and second contacts and the layer of oxide-inhibiting material to liquid phases such that at least the first and second contacts alloy into a eutectic bond comprises heating the first and second contacts and the layer of oxide-inhibiting material to a temperature that renders the first and second contacts and the layer of oxide-inhibiting material to liquid phases such that the first and second contacts and the layer of oxide-inhibiting material alloy into a ternary eutectic bond.

12. The method of claim 1 wherein the second temperature is higher than the first temperature.

13. The method of claim 1 wherein the second temperature is lower than the first temperature.

14. A method of forming a wafer-to-wafer bond, the method comprising:
   forming, on a first wafer, a first contact from a first conductive material subject to surface oxidation when exposed to air;
   disposing a layer of oxide-inhibiting material over a bonding surface of the first contact;
   forming, on a second wafer, a second contact from a second conductive material that, upon heating while in physical contact with the first conductive material, will form a eutectic bond;
   positioning the first and second wafers relative to one another such that a bonding surface of the second contact is in physical contact with the layer of oxide-inhibiting material; and
   after positioning the first and second wafers relative to one another, heating the first and second contacts and the layer of oxide-inhibiting material to a first temperature that renders the first and second contacts and the layer of oxide-inhibiting material to liquid phases such that at least the first and second contacts alloy into a eutectic bond,
   the method further comprising:
      prior to positioning the first and second wafers relative to one another and prior to heating the first and second contacts and the layer of oxide-inhibiting material to the first temperature, disposing a layer of oxide-inhibiting material over a bonding surface of the second contact; and
      prior to positioning the first and second wafers relative to one another and after disposing the layer of oxide-inhibiting material over the bonding surface of the second contact, heating the first and second contacts and the respective layers of oxide-inhibiting material disposed over the bonding surfaces thereof to one or more temperatures that (i) alloy the first conductive material with the oxide-inhibiting material disposed over the bonding surface of the first contact and (ii) alloy the second conductive material with the oxide-inhibiting material disposed over the bonding surface of the second contact.

15. The method of claim 14 wherein heating the first and second contacts and the respective layers of oxide-inhibiting material to the one or more temperatures prior to positioning the first and second wafers relative to one another comprises heating the first contact and the layer of oxide-inhibiting material disposed over the bonding surface of the first contact to a second temperature and heating the second contact and the layer of oxide-inhibiting material disposed over the bonding surface of the second contact to a third temperature, the third temperature being different from the second temperature.

16. The method of claim 15 wherein at least one of the second and third temperatures is higher than the first temperature.

17. The method of claim 14 wherein heating the first and second contacts and the respective layers of oxide-inhibiting material to the one or more temperatures prior to positioning the first and second wafers relative to one another comprises heating the first and second contacts and the respective layers of oxide-inhibiting material to a common second temperature sufficient to (i) alloy the first conductive material with the oxide-inhibiting material disposed over the bonding surface of the first contact and (ii) alloy the second conductive material with the oxide-inhibiting material disposed over the bonding surface of the second contact.

18. The method of claim 17 wherein the second temperature is higher than the first temperature.

* * * * *